(12) United States Patent
Nashner et al.

(10) Patent No.: US 10,071,584 B2
(45) Date of Patent: Sep. 11, 2018

(54) PROCESS FOR CREATING SUB-SURFACE MARKING ON PLASTIC PARTS

(75) Inventors: Michael S. Nashner, San Jose, CA (US); John T. Payne, San Jose, CA (US); Jody R. Akana, San Francisco, CA (US)

(73) Assignee: APPLE INC., Cupertino, CA (US)

(*) Notice: Subject to any disclaimer, the term of this patent is extended or adjusted under 35 U.S.C. 154(b) by 23 days.

(21) Appl. No.: 13/619,208

(22) Filed: Sep. 14, 2012

(65) Prior Publication Data

US 2014/0009873 A1 Jan. 9, 2014

(51) Int. Cl.
| | |
|---|---|
| *G03F 7/00* | (2006.01) |
| *B41M 5/26* | (2006.01) |
| *H05K 5/02* | (2006.01) |
| *G06F 1/16* | (2006.01) |

(52) U.S. Cl.
CPC ............ *B41M 5/267* (2013.01); *G06F 1/1656* (2013.01); *H05K 5/0252* (2013.01)

(58) Field of Classification Search
CPC ..... B41M 5/267; H05K 5/0252; G06F 1/1656
USPC .............................................. 428/34.1, 195.1
See application file for complete search history.

(56) References Cited

U.S. PATENT DOCUMENTS

| | | | |
|---|---|---|---|
| 2,647,079 A | 7/1953 | Burnham | |
| 2,812,295 A | 11/1957 | Patrick | |
| 2,990,304 A | 6/1961 | Cybriwsky et al. | |
| 3,080,270 A | 3/1963 | Fritz | |
| 3,316,866 A | 5/1967 | Shelton | |
| 3,526,694 A | 9/1970 | Lemelson | |
| 3,615,432 A | 10/1971 | Jenkins et al. | |
| 3,645,777 A | 2/1972 | Sierad | |
| RE28,225 E | 11/1974 | Heseltine et al. | |
| 2,346,531 A | 1/1981 | Adachi et al. | |
| 4,247,600 A | 1/1981 | Adachi et al. | |
| 4,269,947 A | 5/1981 | Inata et al. | |
| 4,347,428 A | 8/1982 | Conrad et al. | |
| 4,531,705 A | 7/1985 | Nakagawa et al. | |
| 4,547,649 A | 10/1985 | Butt et al. | |
| 4,564,001 A | 1/1986 | Maeda | |
| 4,651,453 A | 3/1987 | Doyle | |

(Continued)

FOREIGN PATENT DOCUMENTS

| | | |
|---|---|---|
| CN | 1362125 A | 8/2002 |
| CN | 1306526 C | 3/2007 |

(Continued)

OTHER PUBLICATIONS

Shah,Vishu, Handbook of Plastics Testing and Failure Analysis, John Wiley & Sons, Inc., Third Edition, Jun. 14, 2006.*

(Continued)

*Primary Examiner* — Ellen S Wood
(74) *Attorney, Agent, or Firm* — Brownstein Hyatt Farber Schreck, LLP

(57) ABSTRACT

Techniques or processes for providing markings on products are disclosed. In one embodiment, the products have housings and the markings are to be provided on sub-surfaces of the housings. For example, a housing for a particular product can include an outer housing surface and the markings can be provided on a sub-surface of the outer housing surface yet still be visible from the outside of the housing. Since the markings are beneath the surface of the housing, the markings are durable.

18 Claims, 8 Drawing Sheets

(56) References Cited

U.S. PATENT DOCUMENTS

| | | | |
|---|---|---|---|
| 4,686,352 A | 8/1987 | Nawrot et al. | |
| 4,756,771 A | 7/1988 | Brodalla et al. | |
| 4,822,973 A * | 4/1989 | Fahner | B41M 5/267 |
| | | | 219/121.6 |
| 2,989,325 A | 6/1990 | Mullaney | |
| 4,931,366 A | 6/1990 | Mullaney | |
| 4,993,148 A | 2/1991 | Adachi et al. | |
| 5,202,013 A | 4/1993 | Chamberlain | |
| 5,215,864 A | 6/1993 | Laakmann | |
| 5,224,197 A | 6/1993 | Zanoni et al. | |
| 5,288,344 A | 2/1994 | Peker et al. | |
| 5,417,905 A | 5/1995 | Lemaire et al. | |
| 5,420,575 A * | 5/1995 | Cheraso | B41M 5/267 |
| | | | 206/459.5 |
| 5,540,867 A | 7/1996 | DeBello | |
| 5,645,964 A | 7/1997 | Nohr et al. | |
| 5,719,379 A | 2/1998 | Huang et al. | |
| 5,744,270 A | 4/1998 | Pearlman et al. | |
| 5,789,466 A | 8/1998 | Birmingham et al. | |
| 5,808,268 A | 9/1998 | Balz | |
| 5,837,086 A | 11/1998 | Leeb et al. | |
| 5,872,699 A | 2/1999 | Nishii et al. | |
| 5,925,847 A | 7/1999 | Rademacher et al. | |
| 5,943,799 A | 8/1999 | Xu et al. | |
| 6,007,929 A | 12/1999 | Robertson et al. | |
| 6,101,372 A | 8/2000 | Kubo | |
| 6,169,266 B1 | 1/2001 | Hughes | |
| 6,325,868 B1 | 12/2001 | Kim et al. | |
| 6,331,239 B1 | 12/2001 | Shirota et al. | |
| 6,480,397 B1 | 11/2002 | Hsu et al. | |
| 6,574,096 B1 | 6/2003 | Difonzo et al. | |
| 6,590,183 B1 | 7/2003 | Yeo | |
| 6,633,019 B1 | 10/2003 | Gray | |
| 6,746,724 B1 | 6/2004 | Robertson et al. | |
| 6,802,952 B2 | 10/2004 | Hsu et al. | |
| 6,821,305 B2 | 11/2004 | Yan | |
| 6,966,133 B2 | 11/2005 | Krings et al. | |
| 6,996,425 B2 | 2/2006 | Watanabe | |
| 7,065,820 B2 | 6/2006 | Meschter | |
| 7,134,198 B2 | 11/2006 | Nakatani et al. | |
| 7,181,172 B2 | 2/2007 | Sullivan et al. | |
| 7,225,529 B2 | 6/2007 | Wang | |
| 7,284,396 B2 | 10/2007 | Barron et al. | |
| 7,459,373 B2 | 12/2008 | Yoo | |
| 7,508,644 B2 | 3/2009 | Cheung et al. | |
| 7,622,183 B2 | 11/2009 | Shirai et al. | |
| 7,636,974 B2 | 12/2009 | Meschter et al. | |
| 7,691,189 B2 | 4/2010 | En et al. | |
| 8,192,815 B2 | 6/2012 | Weber et al. | |
| 8,367,304 B2 | 2/2013 | Heley et al. | |
| 8,379,678 B2 | 2/2013 | Zhang et al. | |
| 8,379,679 B2 | 2/2013 | Zhang et al. | |
| 8,451,873 B2 | 5/2013 | Zhang | |
| 8,663,806 B2 | 3/2014 | Weber et al. | |
| 8,761,216 B2 | 6/2014 | Zhang | |
| 8,771,919 B2 * | 7/2014 | Wu | B41M 5/267 |
| | | | 428/203 |
| 8,809,733 B2 | 8/2014 | Scott et al. | |
| 8,842,351 B2 | 9/2014 | Lawrence et al. | |
| 8,879,266 B2 | 11/2014 | Jarvis et al. | |
| 8,893,975 B2 | 11/2014 | Sanford et al. | |
| 8,993,921 B2 | 3/2015 | Browning et al. | |
| 9,034,166 B2 | 5/2015 | Tatebe et al. | |
| 9,089,932 B2 | 7/2015 | Lim | |
| 9,132,510 B2 | 9/2015 | Nashner et al. | |
| 9,133,559 B2 | 9/2015 | Silverman | |
| 9,138,826 B2 | 9/2015 | Harrison | |
| 9,173,336 B2 | 10/2015 | Bhatia | |
| 9,185,835 B2 | 11/2015 | Heley et al. | |
| 9,314,871 B2 | 4/2016 | Nashner et al. | |
| 2001/0030002 A1 | 10/2001 | Zheng et al. | |
| 2002/0058737 A1 | 5/2002 | Nishiwaki et al. | |
| 2002/0097440 A1 | 7/2002 | Paricio et al. | |
| 2002/0109134 A1 | 8/2002 | Iwasaki et al. | |
| 2002/0130441 A1 | 9/2002 | Robinson et al. | |
| 2002/0160145 A1 | 10/2002 | Bauhoff | |
| 2003/0006217 A1 | 1/2003 | Dance | |
| 2003/0024898 A1 | 2/2003 | Natsume et al. | |
| 2003/0074814 A1 | 4/2003 | Krings et al. | |
| 2003/0225189 A1 | 12/2003 | Fuller | |
| 2004/0000490 A1 | 1/2004 | Chang | |
| 2005/0023022 A1 | 2/2005 | Kriege et al. | |
| 2005/0034301 A1 | 2/2005 | Wang | |
| 2005/0115840 A1 | 6/2005 | Dolan | |
| 2005/0127123 A1 | 6/2005 | Smithers | |
| 2005/0158576 A1 | 7/2005 | Groll | |
| 2005/0159533 A1 | 7/2005 | Nabeshima et al. | |
| 2005/0263418 A1 | 12/2005 | Bastus Cortes | |
| 2006/0007524 A1 | 1/2006 | Tam | |
| 2006/0055084 A1 | 3/2006 | Yamaguchi et al. | |
| 2006/0066771 A1 | 3/2006 | Hayano et al. | |
| 2006/0105542 A1 | 5/2006 | Yoo | |
| 2006/0225918 A1 | 10/2006 | Chinda et al. | |
| 2007/0018817 A1 | 1/2007 | Marmaropoulos et al. | |
| 2007/0045893 A1 | 3/2007 | Asthana et al. | |
| 2007/0053504 A1 | 3/2007 | Sato et al. | |
| 2007/0262062 A1 | 11/2007 | Guth | |
| 2007/0275263 A1 | 11/2007 | Groll | |
| 2008/0152859 A1 | 6/2008 | Nagal | |
| 2008/0165485 A1 | 7/2008 | Zadesky et al. | |
| 2008/0166007 A1 | 7/2008 | Hankey | |
| 2008/0241478 A1 | 10/2008 | Costin et al. | |
| 2008/0274375 A1 | 11/2008 | Ng et al. | |
| 2008/0295263 A1 | 12/2008 | Meschter et al. | |
| 2008/0299408 A1 | 12/2008 | Guo et al. | |
| 2008/0311369 A1 | 12/2008 | Yokoyama et al. | |
| 2008/0311370 A1 | 12/2008 | Yokoyama et al. | |
| 2009/0017242 A1 | 1/2009 | Weber et al. | |
| 2009/0019737 A1 | 1/2009 | Moreno | |
| 2009/0091879 A1 | 4/2009 | Lim | |
| 2009/0104949 A1 | 4/2009 | Sato et al. | |
| 2009/0136723 A1 | 5/2009 | Zhao | |
| 2009/0190290 A1 | 7/2009 | Lynch et al. | |
| 2009/0194444 A1 | 8/2009 | Jones | |
| 2009/0197116 A1 | 8/2009 | Cheng et al. | |
| 2009/0236143 A1 | 9/2009 | Nakamura | |
| 2009/0260871 A1 | 10/2009 | Weber et al. | |
| 2009/0305168 A1 | 12/2009 | Heley et al. | |
| 2010/0015578 A1 | 1/2010 | Falsafi et al. | |
| 2010/0061039 A1 | 3/2010 | Sanford et al. | |
| 2010/0065313 A1 | 3/2010 | Takeuchi et al. | |
| 2010/0159273 A1 | 6/2010 | Filson et al. | |
| 2010/0159274 A1 | 6/2010 | Filson et al. | |
| 2010/0183869 A1 | 7/2010 | Lin et al. | |
| 2010/0209721 A1 | 8/2010 | Irikura et al. | |
| 2010/0209722 A1 | 8/2010 | Irikura et al. | |
| 2010/0209731 A1 * | 8/2010 | Hamano | B05D 5/067 |
| | | | 428/626 |
| 2010/0294426 A1 | 11/2010 | Nashner | |
| 2010/0300909 A1 | 12/2010 | Hung | |
| 2011/0008618 A1 | 1/2011 | Weedlun | |
| 2011/0048755 A1 | 3/2011 | Su et al. | |
| 2011/0051337 A1 | 3/2011 | Weber et al. | |
| 2011/0089039 A1 * | 4/2011 | Nashner | 205/50 |
| 2011/0089067 A1 | 4/2011 | Scott et al. | |
| 2011/0123737 A1 | 5/2011 | Nashner et al. | |
| 2011/0186455 A1 | 8/2011 | Du et al. | |
| 2011/0193928 A1 | 8/2011 | Zhang et al. | |
| 2011/0193929 A1 | 8/2011 | Zhang et al. | |
| 2011/0194574 A1 | 8/2011 | Zhang et al. | |
| 2011/0155901 A1 | 10/2011 | Hum et al. | |
| 2011/0253411 A1 | 10/2011 | Hum et al. | |
| 2011/0315667 A1 | 12/2011 | Reichenback et al. | |
| 2012/0043306 A1 | 2/2012 | Howerton et al. | |
| 2012/0081830 A1 | 4/2012 | Yeates et al. | |
| 2012/0100348 A1 | 4/2012 | Brokhyser et al. | |
| 2012/0248001 A1 | 10/2012 | Nashner | |
| 2012/0275130 A1 | 11/2012 | Hsu et al. | |
| 2012/0275131 A1 | 11/2012 | Hsu et al. | |
| 2013/0075126 A1 | 3/2013 | Nashner et al. | |
| 2013/0083500 A1 | 4/2013 | Prest et al. | |
| 2013/0129986 A1 | 5/2013 | Heley et al. | |
| 2014/0134429 A1 | 5/2014 | Weber et al. | |
| 2014/0186654 A1 | 7/2014 | Zhang | |

(56) References Cited

U.S. PATENT DOCUMENTS

| | | |
|---|---|---|
| 2014/0363608 A1 | 12/2014 | Russell-Clarke et al. |
| 2014/0367369 A1 | 12/2014 | Nashner et al. |
| 2014/0370325 A1 | 12/2014 | Nashner et al. |
| 2015/0093563 A1 | 4/2015 | Runge et al. |
| 2015/0132541 A1 | 5/2015 | McDonald et al. |
| 2015/0176146 A1 | 6/2015 | Browning et al. |
| 2016/0229941 A1 | 8/2016 | Kuranari et al. |
| 2018/0009200 A1 | 1/2018 | Heo et al. |

FOREIGN PATENT DOCUMENTS

| | | |
|---|---|---|
| CN | 201044438 Y | 2/2008 |
| CN | 101204866 | 6/2008 |
| CN | 102173242 A | 9/2011 |
| DE | 195 23 112 | 6/1996 |
| DE | 102005048870 A1 | 4/2007 |
| EP | 0031463 | 7/1981 |
| EP | 0 114 565 A1 | 8/1984 |
| EP | 121150 A1 | 10/1984 |
| EP | 0234121 | 9/1987 |
| EP | 0 633 585 A | 1/1995 |
| EP | 0 997 958 A1 | 5/2000 |
| EP | 2 399 740 A1 | 12/2011 |
| EP | 2488369 B1 | 3/2014 |
| GB | 788 329 A | 12/1957 |
| JP | 57-149491 A | 9/1982 |
| JP | 03 013331 A | 1/1991 |
| JP | 03 138131 A | 6/1991 |
| JP | 3-203694 A | 9/1991 |
| JP | 06-126192 | 5/1994 |
| JP | A H06-212451 | 8/1994 |
| JP | 06-320104 | 11/1994 |
| JP | 7-204871 A | 8/1995 |
| JP | 2000-000167 | 1/2000 |
| JP | 2002/370457 | 12/2002 |
| JP | 2003055794 | 2/2003 |
| JP | 2005/22924 | 1/2005 |
| JP | A2006-138002 | 6/2006 |
| JP | 2008 087409 A | 4/2008 |
| WO | WO 98/53451 | 11/1998 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2007/088233 A1 | 8/2007 |
| WO | WO 2008/092949 A1 | 8/2008 |
| WO | WO 2009/051218 A1 | 4/2009 |
| WO | WO 2010/095747 A1 | 8/2010 |
| WO | WO 2010/111798 A1 | 10/2010 |
| WO | WO 2010/135415 | 11/2010 |
| WO | WO 2010/135415 A2 | 11/2010 |
| WO | WO 2011/047325 A1 | 4/2011 |

OTHER PUBLICATIONS

Annerfors et al., "Nano Molding Technology on Cosmetic Aluminum Parts in Mobile Phones", Division of Production and Materials Engineering, LTH, 2007.
"Thermal Shock Resistant Conformal Coating", Product Data Sheet, Dymax Corporation, Jul. 9, 2007, pp. 1-2.
"Marking Lasers: Marking without Limitations", Trumpf Inc., Sep. 10, 2007, pp. 1-36.
"UV-Curing Sheet Adhesives", ThreeBond Technical News, Issued Jul. 1, 2009, 8 pages.
Chang, "Lasers Make Other Metals Look Like Gold", New York Times, nytimes.com, 2 pgs., Jan. 31, 2008.
"Database EPI" Week 201107 Thomas Scientific, London, GB; AN 2010-Q46184, Nov. 17, 2010, 1 pg.
International Search Report for International Patent Application No. PCT/US2013/046427, dated Jul. 30, 2013.
Written Opinion for International Patent Application No. PCT/US2013/046427, dated Jul. 30, 2013.
Hajdu, "Chapter 7", 1990, William Andrew Publishing from www.knovel.com, pp. 193-206.

* cited by examiner

| | |
|---|---|
| Laser Model | FOBA DP2UV |
| Laser Type | Ultra-Violet DPSS YVO4 |
| Average Power in Watts | 1 |
| Wavelength in Nanometers | 355 |
| Pulse Width in Nanoseconds | 20 |
| Frequency in Kilohertz | 35 |
| Pulse Energy in milliJoules | 0.03 |
| Peak Power in Kilowatts | 2.22 |
| Spot Diameter (1/e^2) in microns | 30 |
| Fluence in Joules per square centimeter | 4 |
| Irradiance in Gigawatts per square centimeter | 0.2 |
| Line Spacing in microns | 30 |
| Scan Speed in millimeters per second | 500 |
| Hatch | 4 Passes At 0, 45, 90 and 135 Degrees |

FIG. 4D

PROCESS FOR CREATING SUB-SURFACE MARKING ON PLASTIC PARTS

CROSS-REFERENCE TO EARLIER APPLICATIONS

This application claims priority to U.S. Provisional Patent Application No. 61/669,565 filed Jul. 9, 2012, entitled "PROCESS FOR CREATING SUB-SURFACE MARKING ON PLASTIC PARTS," which is herein incorporated by reference.

This application references U.S. application Ser. No. 12/643, 772, filed Dec. 21, 2009 and entitled "SUB-SURFACE MARKING OF PRODUCT HOUSINGS," which is hereby incorporated herein by reference, which claims priority benefit of U.S. Provisional Application No. 61/252, 623, filed Oct. 16, 2009 and entitled "SUB-SURFACE MARKING OF PRODUCT HOUSINGS," which is hereby incorporated herein by reference.

BACKGROUND OF THE INVENTION

Field of the Invention

The present invention relates to marking products and, more particularly, marking outer housing surfaces of electronic devices.

Description of the Related Art

Consumer products, such as electronic devices, have been marked with different information for many years. For example, it is common for electronic devices to be marked with a serial number, model number, copyright information and the like. Conventionally, such marking is done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the marking be very small. In order for such small marking to be legible, the marking must be accurately and precisely formed. Unfortunately, however, conventional techniques are not able to offer sufficient accuracy and precision. Thus, there is a need for improved techniques to mark products.

SUMMARY

The invention pertains to techniques or processes for providing markings on products. In one embodiment, the products have housings and the markings are to be provided on sub-surfaces of the housings. For example, a housing for a particular product can include an outer housing surface and the markings can be provided on a sub-surface of the outer housing surface, yet still be visible from the outside of the housing. Since the markings are beneath the surface of the housing, the markings are durable. The markings provided on products can be textual and/or graphic. The markings can be formed with high resolution. The markings are also able to be dark, even on plastic surfaces.

In general, the markings (also referred to as annotations or labeling) provided on products according to the invention can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

The invention can be implemented in numerous ways, including as a method, system, device, or apparatus. Several embodiments of the invention are discussed below.

As a method for marking an article, one embodiment can, for example, include at least providing a base structure for the article, coating the base structure to provide a coating layer and an outer coating surface of the base structure, and subsequently altering surface characteristics of selective portions of an inner surface of the base structure.

As an electronic device housing, one embodiment can, for example, include at least a housing structure including at least an inner portion and an outer portion. In addition, to provide predetermined marking of the electronic device housing, a surface of the inner portion adjacent the outer portion has selectively altered surface regions. The selectively altered surface regions on the surface of the inner portion can be altered through the outer portion.

As an article, one embodiment can, for example, include a base polymer layer for the article a thick film coupled to the base polymer layer and covering an inner surface of the base polymer layer, and substantially black laser markings of selective portions of the inner surface of the base polymer layer.

As a method for marking an article, another embodiment can, for example, include at least: providing a plastic structure for at least a portion of the article; coating the plastic structure with an acrylic resin to provide a transparent protective coating on the plastic structure; and subsequently producing markings on the article, the marking being formed on the plastic structure and beneath the transparent protective coating, and the markings being visible through the transparent protective coating.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which:

FIG. 4D is a table illustrating exemplary laser operation parameters for marking the plastic structure according to one embodiment.

DETAILED DESCRIPTION OF EMBODIMENTS OF THE INVENTION

The invention pertains to techniques or processes for providing markings on products. In one embodiment, the products have housings and the markings are to be provided on sub-surfaces of the housings. For example, a housing for a particular product can include an outer housing surface and the markings can be provided on a sub-surface of the outer housing surface, yet still be visible from the outside of the housing. Since the markings are beneath the surface of the housing, the markings are durable. The markings provided on products can be textual and/or graphic. The markings can be formed with high resolution. The markings are also able to be dark, even on plastic surfaces.

In general, the markings (also referred to as annotations or labeling) provided on products according to the invention can be textual and/or graphic. The markings can be used to provide a product (e.g., a product's housing) with certain information. The marking can, for example, be used to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like). When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

Exemplary embodiments of the invention are discussed below with reference to FIGS. 1-8. However, those skilled in the art will readily appreciate that the detailed description given herein with respect to these figures is for explanatory purposes as the invention extends beyond these limited embodiments.

Figure 1:
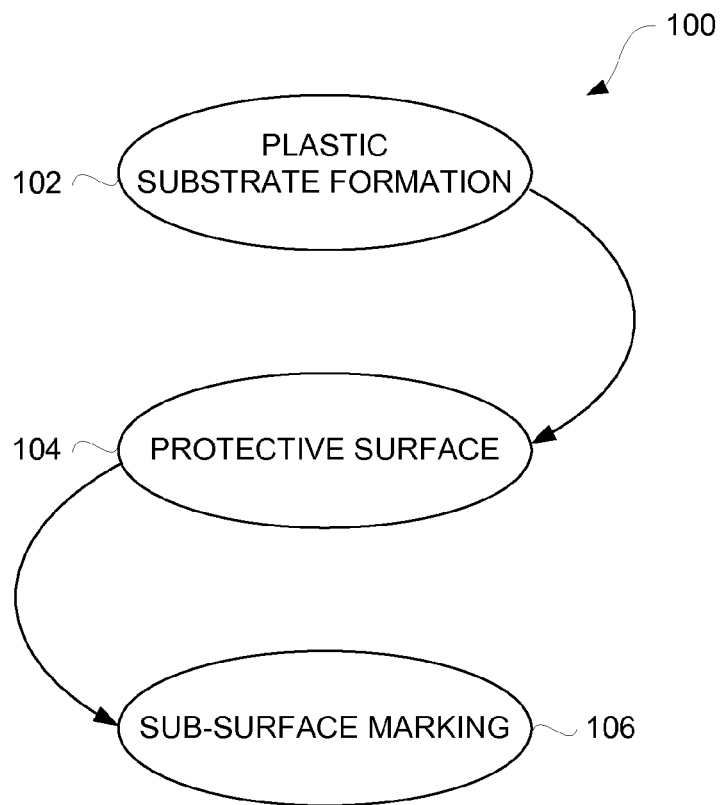
FIG. 1 is a diagram of a marking state machine according to one embodiment of the invention.

FIG. 1 is a diagram of a marking state machine 100 according to one embodiment of the invention. The marking state machine 100 reflects three (3) basic states associated with marking an electronic device. Specifically, the marking can mark a housing of an electronic device, such as a portable electronic device.

The marking state machine 100 may include a plastic substrate formation state 102. At the plastic substrate formation state 102, a plastic substrate can be obtained or produced. For example, the plastic substrate can represent at least a portion of a housing surface of an electronic device. Next, the marking state machine 100 can transition to a protective surface state 104. At the protective surface state 104, a protective surface can be formed or applied to at least one surface of the plastic substrate. The protective surface can be used to protect the surface of the plastic substrate. For example, the protective surface can be a more durable surface than that of the surface of the plastic substrate. For example, the plastic substrate may comprise polycarbonate and the protective surface may comprise an ultraviolet light curable transparent acrylic resin coating. Next, the marking state machine 100 can transition to a sub-surface marking state 106. At the sub-surface marking state 106, marking can be produced on a sub-surface of the plastic substrate. In particular, the sub-surface marking can be performed on the plastic substrate below the protective surface. The protective surface is typically substantially translucent to allow the sub-surface marking to be visible through the protective surface. The marking can be provided with high resolution and can be protected. Since the marking is provided on a sub-surface, the marking is not only protected but also has the cosmetic advantage of not being perceptible of tactile detection on the surface.

Figure 2:
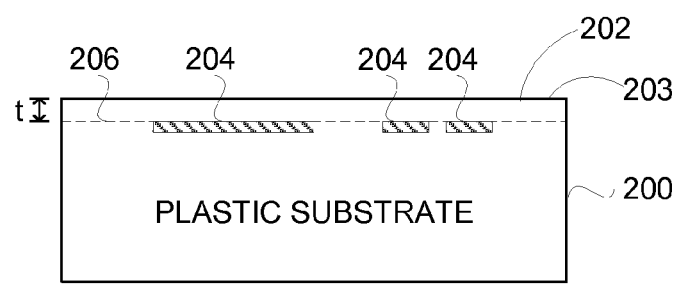
FIG. 2 is an illustration of a substrate having sub-surface alterations according to one embodiment.

FIG. 2 is an illustration of a plastic substrate 200 having sub-surface alterations 204 according to one embodiment. The sub-surface alterations 204 may be provided below an outer surface 202 of the plastic substrate 200. More generally, plastic substrate 200 may provide a base structure 200. Coating of base structure 200 may be employed for providing coating layer 203 and outer coating surface 202 of the base structure 200 (or plastic substrate 200.) The sub-surface alterations 204 may be provided below outer coating surface 202 of the plastic substrate 200, on selective portions of an inner surface 206 of the base structure 200 (or plastic substrate 200.)

Given that the outer surface 203 may typically be substantially translucent (e.g., clear), the sub-surface alterations 204 are visible by a user through the outer surface 203. Accordingly, the sub-surface alterations 204 can provide markings on the plastic substrate 200. Since the markings are provided by the sub-surface alterations 204, the markings may be protected by the coating layer 202 and by the outer coating surface 202.

Base structure 200 may comprise, and more particularly inner surface 206 of base structure 200 may comprise plastic or plastic polymers, for example polycarbonate. Base structure 200 may be, and more particularly inner surface 206 of base structure 200 may be substantially rigid.

Metal, or more particularly metal oxide or crystalline metal oxide (e.g. titanium dioxide) may be incorporated into the plastic, or with the plastic polymers, or into the polycarbonate. Base structure 200 may comprise, and more particularly inner surface 206 of base structure 200 may comprise metal, or metal oxide or crystalline metal oxide (e.g. titanium dioxide). Base structure 200 may be, and more particularly inner surface 206 of base structure 200 may be substantially opaque. Base structure 200 may have, and more particularly inner surface 206 of base structure 200 may have a substantially white appearance. Base structure 200 may have, and more particularly inner surface 206 of base structure 200 may have a lightness factor $L^*$ in a visible color space that is substantially greater than ninety.

For visual appearance discussions herein directed to lightness (or darkness) and chromaticness, such as appearance of housings or base structures, and appearance of selectively altered surface regions or markings on the housing and the like, appearance may be described using CIE 1976 $L^*a^*b^*$ (also known as CIELAB). This is a color space standard specified by the International Commission on Illumination (French Commission internationale de l'éclairage, hence its CIE initialism).

The three coordinates of the CIELAB standard represent: 1) the lightness factor magnitude of the color ($L^*=0$ yields ultimate black and $L^*=100$ indicates diffuse ultimate white, 2) its position between red/magenta and green ($a^*$, negative values indicate green while positive values indicate red/magenta) and 3) its position between yellow and blue ($b^*$, negative values indicate blue and positive values indicate yellow). Measurements in a format corresponding to the CIELAB standard may be made using a spectrophotometer, such as the COLOREYE™ XTH spectrophotometer, which was sold by GretagMacbeth™. Similar spectrophotometers are available from X-Rite™.

Coating layer 202 shown in FIG. 2 may be substantially harder, and more particularly outer coating surface 203 may be substantially harder than hardness of base structure 200 (and may be substantially harder than hardness of inner surface 206 of base structure 200.) Composition of coating layer 202 may be substantially different, and more particularly composition of outer coating surface 203 may be substantially different than composition of base structure 200 (and may be substantially different than composition of inner surface 206 of base structure 200.) Coating layer 202, and more particularly outer coating surface 203 may be substantially free of metal. Protective surface 203, such as outer coating surface 203 of coating layer 202 may comprise an ultraviolet light curable transparent acrylic coating.

Coating layer 202, and more particularly outer coating surface 203 may be substantially nonporous. Further, the coating layer 202 may be a thick film 202. The thickness "t" of coating layer 202 may be sufficiently thick for substantially avoiding oxidation of the selectively altered surface regions 204, when the selectively altered surface regions 204 may be altered through the coating layer 202. For example, oxidation may be substantially avoided when the selectively altered surface regions 204 may be altered through the coating layer 202 by directing a laser output through the coating layer 202 to inner surface 206. The thickness dimension "t" of coating layer 202 may be within a range of approximately fifteen microns to approximately fifty microns. The thickness dimension "t" of coating layer 202 may be sufficiently thin for substantially avoiding laser attenuation. The thickness dimension "t" may be sufficiently thick so that the selectively altered surface regions 204 on inner surface 206 may be altered through the coating layer 202 without noticeable disturbance of the coating layer 202.

The selectively altered surface regions 204, which may be laser markings, may have a substantially black appearance. It is theorized that using the coating layer 202 for substantially avoiding oxidation of the inner surface 206 of the base structure may play a role (along with laser operating parameters) in providing desirable darkness (low lightness) and low chromaticness magnitude in the substantially black appearance of the selectively altered surface regions 204. Study has shown that when laser operating parameters are selected for the substantially black appearance, desirable greater darkness (lower lightness) and desirable lower chromaticness magnitude are both achievable for sub-surface marking of inner surface 206, for example, using coating layer 206. The merit of this sub-surface marking achievement of greater darkness and lower chromaticness magnitude, for example, using coating layer 206, may be relative to an alternative scheme of marking an exposed plastic substrate, for example, uncovered by any metal free coating layer.

For example, using the coating layer 206 (and suitable laser operating parameters as discussed in further detail subsequently herein) the selectively altered surface regions 204 may have a lightness factor $L^*$ in a visible color space of substantially less than fifty, and may have a lightness factor $L^*$ in the visible color space of approximately thirty. The selectively altered surface regions 204 may have a chromaticness of a greenness-redness factor $a^*$ in the visible color space substantially within a range from approximately negative three to approximately positive three. The selectively altered surface regions 204 may have a chromaticness of a blueness-yellowness factor $b^*$ in the visible color space substantially within a range from approximately negative five to approximately positive five.

The plastic substrate 200 shown in FIG. 2 (or more generally, the base structure 200) can represent at least a portion of a housing of an electronic device. The marking being provided to the plastic substrate can provide text and/or graphics to an outer housing surface of a portable electronic device. The marking techniques are particularly useful for smaller scale portable electronic devices, such as handheld electronic devices. Examples of handheld electronic devices include mobile telephones (e.g., cell phones), Personal Digital Assistants (PDAs), portable media players, remote controllers, pointing devices (e.g., computer mouse), game controllers, etc.

The marking is, in one embodiment, particularly well-suited for applying text and/or graphics to a housing of an electronic device. As noted above, the plastic substrate can represent a portion of a housing of an electronic device. Examples of electronic devices, namely, handheld electronic devices, include mobile telephones (e.g., cell phones), Personal Digital Assistants (PDAs), portable media players, remote controllers, pointing devices (e.g., computer mouse), game controllers, etc.

Figure 3:
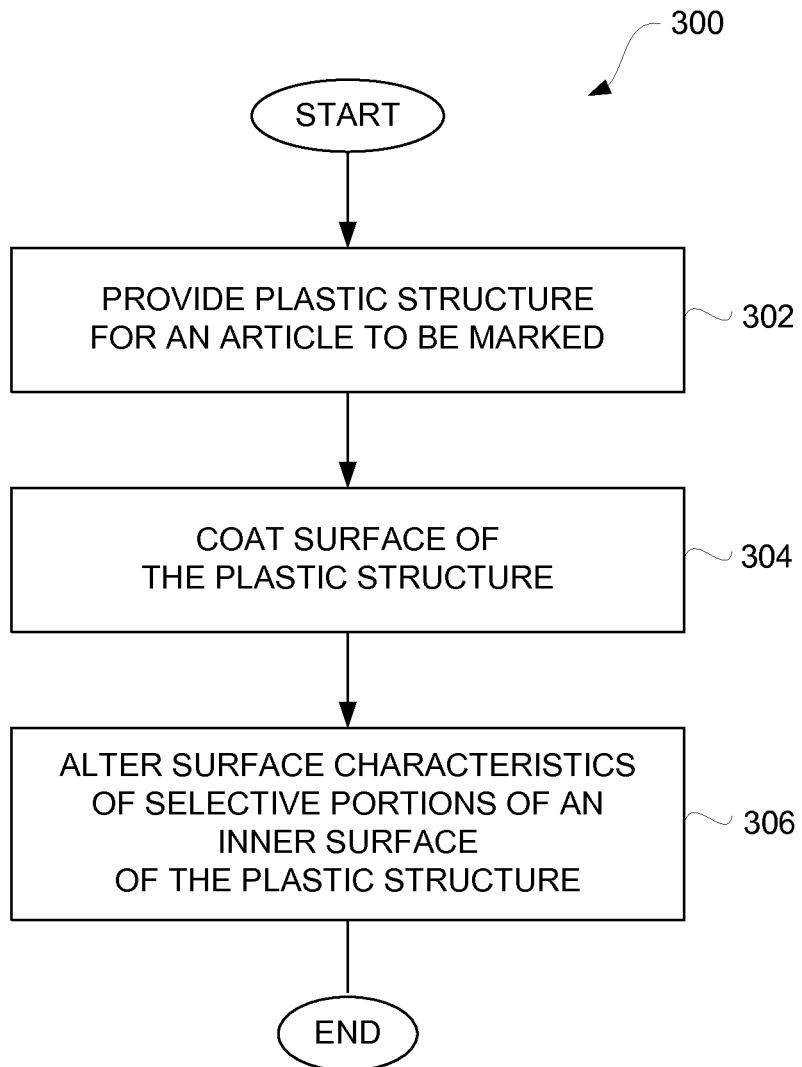
FIG. 3 is a flow diagram of a marking process according to one embodiment.

FIG. 3 is a flow diagram of a marking process 300 according to one embodiment. The marking process 300 can be performed on an electronic device that is to be marked. The marking process 300 is, for example, suitable for applying text or graphics to a housing (e.g., an outer housing surface) of an electronic device. The marking can be provided such that it is visible to users of the electronic device. However, the marking can be placed in various different positions, surfaces or structures of the electronic device.

The marking process 300 can provide 302 a plastic structure (or more generally a base structure) for an article to be marked. The plastic structure can pertain to a plastic housing for an electronic device, such as a portable electronic device, to be marked. The plastic structure can be formed of one plastic layer. The plastic structure can also be formed of multiple layers of different materials, where at least one of the multiple layers is a plastic layer. The plastic structure and more particularly its surface may comprise polymers and may comprise polycarbonate. The plastic structure may be, and more particularly its surface may be substantially rigid. Metal, or more particularly metal oxide or crystalline metal oxide (e.g. titanium dioxide) may be incorporated into the plastic, or with the plastic polymers, or into the polycarbonate. The plastic structure, and more particularly its surface may be substantially opaque and may have a substantially white appearance.

After the plastic structure has been provided 302, a surface of the plastic structure can be coated 304 using a coating layer, so that the surface of the plastic structure may then provide an inner surface, which may be covered by the coating layer. Typically, the surface of the plastic structure to be coated 304 is an outer or exposed plastic surface of the plastic structure. Prior to coating 304, the outer or exposed surface typically represents an exterior surface of the plastic housing for the electronic device. After coating 304, the coating layer may provide an outer coating surface for the plastic structure, and the coating layer may cover the formerly exposed, but not now covered surface (i.e. inner surface) of the plastic structure.

For example, in one embodiment, the coating 302 may comprise spraying (or otherwise applying) an ultraviolet light curable transparent acrylic resin to cover the inner surface of the plastic structure. Suitable ultraviolet light curable transparent acrylic resins are available from manufacturers such as BASF Societas Europaea, Donbon Orgin Electric Company and Natoco Company Limited. The ultraviolet light curable transparent acrylic resin may further include peroxide UV photo-initiator, solvent and other additives to improve flow and/or leveling.

Composition of the coating layer may be substantially different, and more particularly composition of outer coating surface may be substantially different than composition of the base/plastic structure (and may be substantially different than composition of inner surface of the base/plastic structure.) The coating layer, and more particularly the outer coating surface may be substantially free of metal.

Once applied, the ultraviolet light curable transparent acrylic resin may be cured by exposure under a suitable strength ultraviolet lamp for a sufficient period of time. For example a 900 to 1,300 mJ/cm2 ultraviolet lamp may be employed. Once cured, the transparent acrylic resin may be substantially harder than hardness of base/plastic structure. The transparent acrylic resin may be substantially nonporous.

After coating 304 and curing, surface characteristics of selected portions of an inner surface of the plastic structure can be altered 306. The surface characteristics can be altered 306 using a laser, such as an ultraviolet wavelength laser. For example, one specific suitable laser is a one (1) Watt average power, ultraviolet wavelength multi-nanosecond pulsewidth laser operated at approximately 35 Kilohertz with a scan speed of approximately 500 millimeters per second. While such ultraviolet laser may provide many advantages, it may be more expensive than alternative lasers. Accordingly, examples of alternative lasers are infrared wavelength lasers and green lasers nanosecond pulsewidth lasers of nanosecond and/or picosecond pulse ranges. Following the block 306, the marking process 300 can end.

Figure 4A:
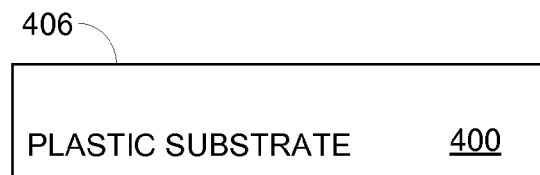
FIGS. 4A-4C are diagrams illustrating marking of a plastic structure according to one embodiment.
Figure 4B:
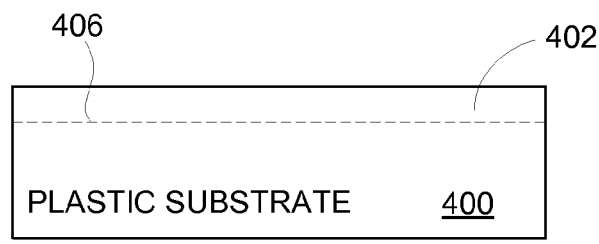
Figure 4C:
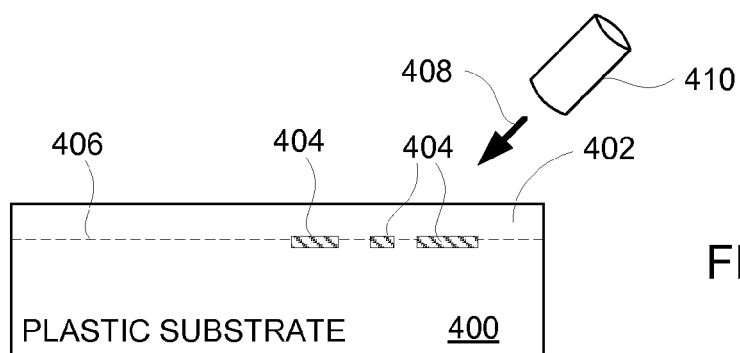

FIGS. 4A-4C are diagrams illustrating marking of a structure including at least an inner portion 400 and an outer portion 402. The structure may comprise a housing structure for an electronic device housing, and the inner portion 400 may comprise a plastic substrate 400. In addition, to provide predetermined marking of the electronic device housing, a surface 406 of the inner portion 400 adjacent the outer portion 402 may have selectively altered surface regions 404. The selectively altered surface regions 404 on the surface 406 of the inner portion 400 can be altered through the outer portion 402.

FIG. 4A illustrates a base for inner portion 400. As an example, the inner portion 400 and more particularly its surface 406 may comprise polymers and may comprise polycarbonate. The inner portion 400 may be, and more particularly its surface 406 may be substantially rigid. Metal, or more particularly metal oxide or crystalline metal oxide (e.g. titanium dioxide) may be incorporated into the plastic, or with the plastic polymers, or into the polycarbonate. The inner portion 400, and more particularly its surface 406 may be substantially opaque and may have a substantially white appearance.

FIG. 4B illustrates the inner portion 400 after outer portion 402 has been formed on its surface 406. For example, surface 406 may be coated with ultraviolet light curable transparent acrylic resin. This may be cured to form outer portion 402. Using reasoning as discussed previously herein, the thickness of the outer portion 402 may, for example, may be within a range of approximately fifteen microns to approximately fifty microns.

Outer portion 402 may be substantially harder than hardness of inner portion 400 (and may be substantially harder than hardness of surface 406 of inner portion 400.) Composition of outer portion 402 may be substantially different than composition of inner portion 400 (and may be substantially different than composition of surface 406 of inner portion 400.) Outer portion 402 may be substantially free of metal. Outer portion 402 may be substantially nonporous.

After the outer portion 402 has been formed on the inner portion 400, FIG. 4C illustrates altered surfaces 404 being selectively formed on inner surface 406 of inner portion 400. The altered structures 404 are formed by optical energy 408 produced by a laser 410 (e.g., ultraviolet wavelength laser). The altered surfaces 404 combine to provide marking of the inner portion 400. For example, the altered surfaces 404 may appear to be substantially black and thus when selectively formed can provide marking. Selectively altered surface regions 404 may comprise regions where the metal oxide (e.g. titanium dioxide) may be substantially decrystallized. It is theorized that optical energy may play a role in such decrystallizaiton. The marking may be visible through the outer portion 402, which can be substantially translucent. If the outer portion 402 is primarily clear, the resulting marking can be appear as substantially black.

The laser 410 may include a galvanometer mirror or other arrangement for raster scanning a spot of the optical energy over the inner surface 406, so as to form the altered structures into a rasterized depiction of the marking indicia. Suitable pitch between raster scan lines of the scanning spot may be selected. For example, a suitable pitch may be a line spacing of about thirty (30) microns. Multiple passes of scan lines at various angled orientations of the scan lines may be employed to provide a hatching arrangement or the scan lines. For example, four scan line passes may be arranged at relative angles of zero, forty-five, ninety and one-hundred-thirty-five degrees. The laser may further include optics for contracting or expanding size of the spot of the optical energy, by focusing or defocusing the spot. Spot size of the optical energy for the nanosecond class laser mentioned previously herein may be approximately thirty (30) microns.

The outer portion 402 may be a thick film 402. The thickness of outer portion 402 may be sufficiently thick for substantially avoiding oxidation of selectively altered surface regions 404, when the selectively altered surface regions 404 may be altered through the outer portion 402 (for example, when the selectively altered surface regions 404 may be altered through the outer portion 402 by directing the output of laser 410 through the outer portion 402 to inner surface 406.) The thickness dimension of outer portion 402 may be sufficiently thin for substantially avoiding laser attenuation. The thickness dimension may be sufficiently thick so that the selectively altered surface regions 404 on surface 406 may be altered through the outer portion 402 without noticeable disturbance of the outer portion 402.

FIG. 4D is a table illustrating exemplary laser operation parameters for marking the plastic structure according to one embodiment. In particular, the table of FIG. 4D shows an example of a suitable laser model, which may be used for marking the plastic structure. The FOBA DP2UV is an ultra-violet Diode Pumped Solid State Neodymium-Doped Yttrium Orthovanadate (DPSS YVO4) type laser, which is available from FOBA Technology and Services GmbH, having offices at 159 Swanson Road, Boxborough, Mass. It should be understood that the table of FIG. 4D shows approximate exemplary laser operating parameters, and that various other laser operating parameters may be selected to provide the fluence of the optical energy that forms the altered structures of the base plastic structure.

Figure 5:
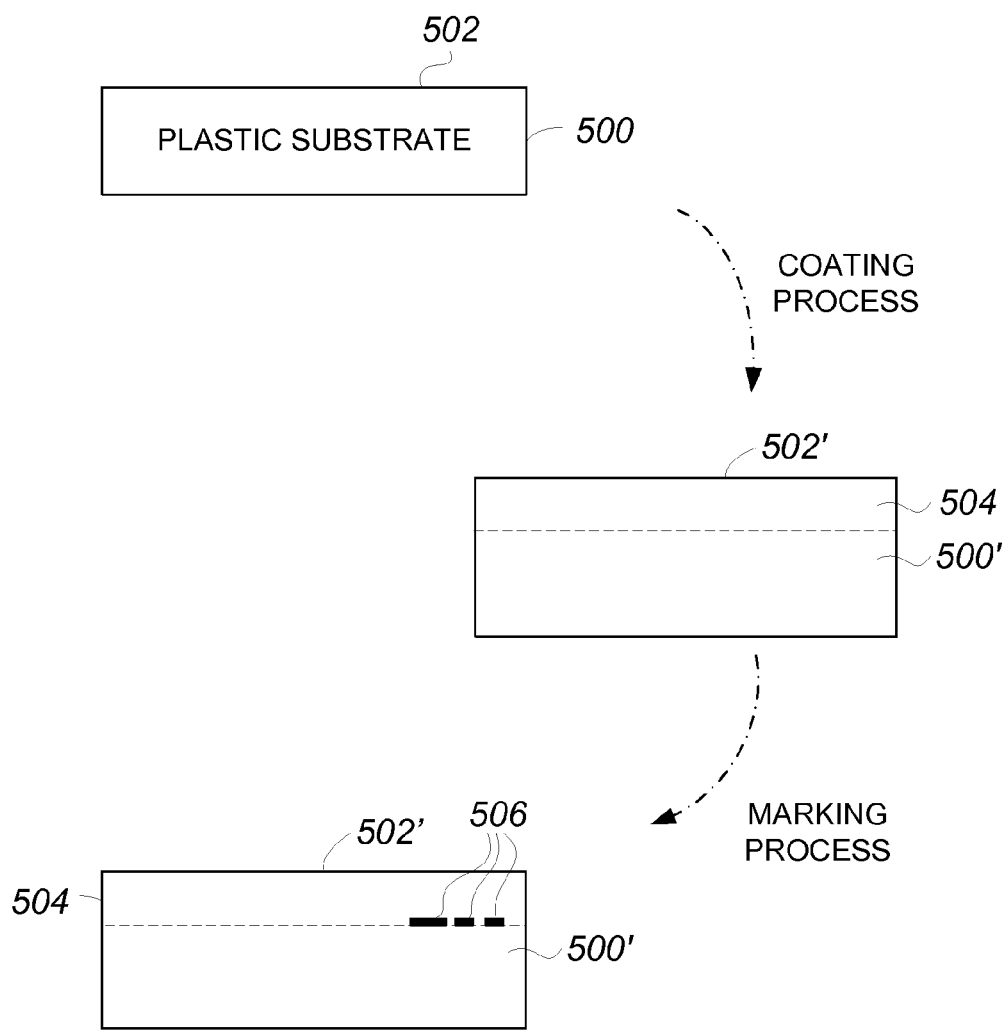
FIG. 5 is a flow diagram of a multi-stage marking process according to another embodiment.

FIG. 5 is a flow diagram of a multi-stage marking process 500 according to another embodiment. As shown in FIG. 5, a substrate 500 can be provided to coating process that causes a coating layer 504 to be formed on at least one surface of the substrate 500. The substrate 500 may comprise a plastic substrate 500. The substrate 500 may include an exposed surface 502. The coating layer 504 provided by the coating process may serve to coat the exposed surface 502. Once coated, the exposed surface 502 is a coated exposed surface 502'. After the substrate 500 has been coated by the coating process, the coated substrate 500' can be provided to a marking process. The marking process may operate to produce altered surfaces 506 to the coated substrate 500' below the coated exposed surface 502'. The altered surfaces 506 provide the marking to the coated substrate 500'. By controlling size, placement and/or darkness of the altered surfaces 506, the marking can be selectively provided to the coated substrate 500'.

Figure 6A:
FIGS. 6A-6D are diagrams illustrating marking of a multi-layer structure according to one embodiment.
Figure 6B:

FIGS. 6A-6D are diagrams illustrating marking of a multi-layer structure according to one embodiment. FIG. 6A illustrates a metal layer 600. The metal layer 600 can be a metal, such as aluminum or stainless steel. FIG. 6B illustrates the metal layer 600 after a base polymer layer 602 is provided on the base metal layer 600. The base polymer layer 602 may comprise polycarbonate. Metal, or more particularly metal oxide or crystalline metal oxide (e.g. titanium dioxide) may be incorporated with the plastic polymer layer 602, or more particularly into the polycarbonate.

Figure 6C:
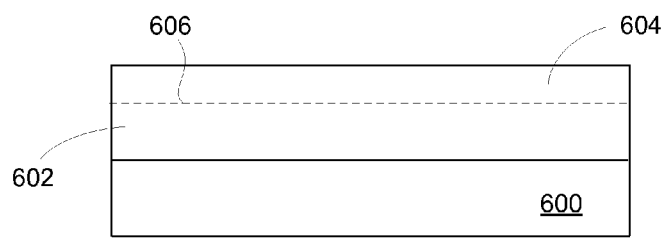

FIG. 6C illustrates the metal structure 600 after the base polymer layer 602 has been coated to form a thick film 604. Thick film 604 may be formed by applying and curing an ultraviolet light curable transparent acrylic resin. As the thick film 604 is formed, the thick film 604 may be coupled to the base polymer layer 602 and may cover an inner surface 606 of the base polymer layer 602. Base polymer layer may be, and more particularly inner surface 606 of base polymer layer 602 may be substantially rigid. Base polymer layer 602 may comprise, and more particularly inner surface 606 of base polymer layer 602 may comprise metal, or metal oxide or crystalline metal oxide (e.g. titanium dioxide). Base polymer layer 602 may have, and more particularly inner surface 606 of base polymer layer 602 may have a substantially white appearance. The inner surface of the base polymer layer 602 may have a lightness factor L* in a visible color space that is substantially greater than ninety.

Thick film 604 may be substantially harder than hardness of base polymer layer 602 (and may be substantially harder than hardness of inner surface 606 of base polymer layer 602.) Composition of thick film 604 may be substantially different than composition base polymer layer 602 (and may be substantially different than composition of inner surface 606 of base polymer layer 602.) Thick film 604 may be substantially free of metal. Thick film 604 may be substantially nonporous. Thick film 604 may have a thickness dimension within a range of approximately fifteen microns to approximately fifty microns.

Figure 6D:
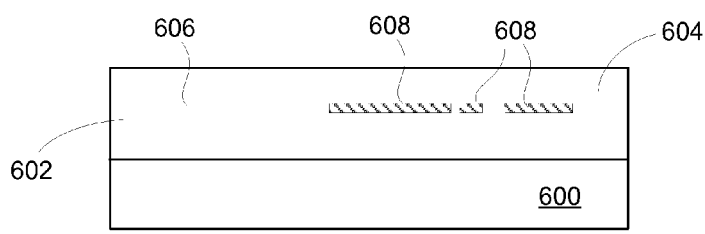

Next, FIG. 6D illustrates substantially black laser markings 608 being selectively formed at inner surface 606 of base polymer layer 602. The substantially black laser markings 608 may comprise one or more textual or graphical indicia. The resulting marking may be visible through the thick film 604, which may be substantially translucent.

It is theorized that using the thick film 604 for substantially avoiding oxidation of inner surface 606 of the base polymer layer may play a role (along with laser operating parameters) in providing desirable darkness (low lightness) and low chromaticness magnitude in the substantially black appearance of laser markings 608. Using the thick film 604 (and suitable laser operating parameters as discussed in in detail previously herein) the substantially black laser markings 608 may have a lightness factor L* in a visible color space of substantially less than fifty, and may have a lightness factor L* in the visible color space of approximately thirty. The substantially black laser markings 608 may have a chromaticness of a greenness-redness factor a* in the visible color space substantially within a range from approximately negative three to approximately positive three. The substantially black laser markings 608 may have a chromaticness of a blueness-yellowness factor b* in the visible color space substantially within a range from approximately negative five to approximately positive five.

Figure 7:
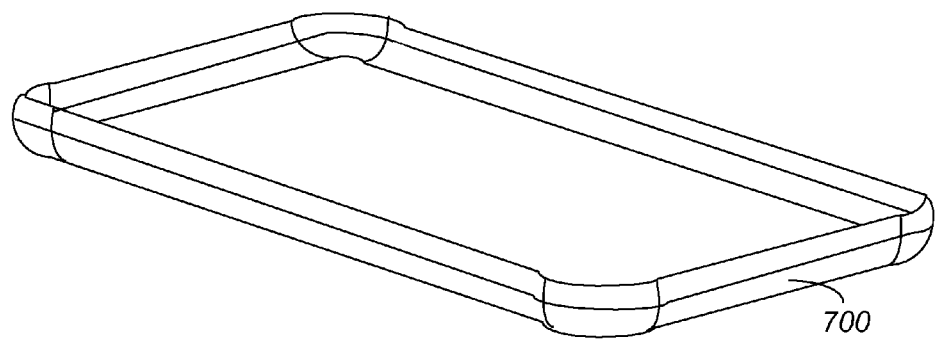
FIG. 7 is a diagrammatic representation of an exemplary housing to be marked.

FIG. 7 is a diagrammatic representation of an exemplary housing 700 to be marked. The housing 700 may comprise plastic. The housing 700 may be a housing that is to be a part of an overall assembly, as for example a bottom of a cell phone assembly or portable media player.

Figure 8:
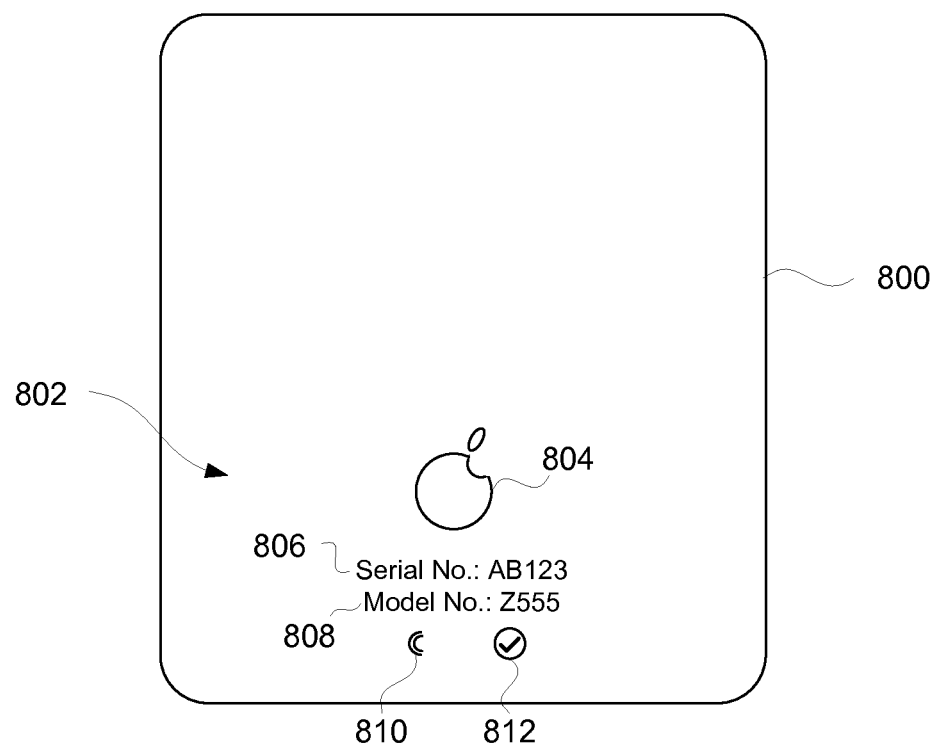
FIG. 8 illustrates the product housing having markings according to one exemplary embodiment.

FIG. 8 illustrates product housing 800, which may comprise plastic. The product housing may have markings 802 according to one exemplary embodiment. The markings 802 can be produced on a sub-surface of the product housing 800 in accordance with any embodiment discussed previously herein. In this example, the labeling includes a logo graphic 804, serial number 806, model number 808, and certification/approval marks 810 and 812.

The marking processes described herein are, for example, suitable for applying text or graphics to a housing surface (e.g., an outer housing surface) of an electronic device. The marking processes are, in one embodiment, particularly well-suited for applying text and/or graphics to an outer housing surface of a portable electronic device. Examples of portable electronic devices include mobile telephones (e.g., cell phones), Personal Digital Assistants (PDAs), portable media players, remote controllers, pointing devices (e.g., computer mouse), game controllers, etc. The portable electronic device can further be a hand-held electronic device. The term hand-held generally means that the electronic device has a form factor that is small enough to be comfortably held in one hand. A hand-held electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

Additional information on product marking as well as other manufacturing techniques and systems for electronic devices are contained in: (i) U.S. application Ser. No. 12/643, 772, filed Dec. 21, 2009 and entitled "SUB-SURFACE MARKING OF PRODUCT HOUSINGS," which is hereby incorporated herein by reference; and (ii) U.S. Provisional Patent Application No. 61/059,789, filed Jun. 8, 2008, and entitled "Methods and Systems for Manufacturing an Electronic Device," which is hereby incorporated herein by reference.

This application also references: (i) U.S. Provisional Patent Application No. 61/121,491, filed Dec. 10, 2008, and entitled "Techniques for Marking Product Housings," which is hereby incorporated herein by reference; (ii) U.S. patent application Ser. No. 12/358,647, filed Jan. 23, 2009, and entitled "Method and Apparatus for Forming a Layered Plastic Structure with an Coated Surface," which is hereby incorporated herein by reference; and (iii) U.S. patent application Ser. No. 12/475,597, filed May 31, 2009, and entitled "Techniques for Marking Product Housings," which is hereby incorporated herein by reference.

The various aspects, features, embodiments or implementations of the invention described above can be used alone or in various combinations.

Different aspects, embodiments or implementations may, but need not, yield one or more of the following advantages. One advantage of the invention may be that the markings are able to be dark (low lightness) with low chromaticness magnitude, even on plastic surfaces. Another advantage may be that desirable greater darkness (lower lightness) and desirable lower chromaticness magnitude are both achievable for sub-surface marking of an inner surface, for example, using a coating layer. Another advantage may be that greater darkness (lower lightness) and lower chromaticness magnitude markings may provide for greater visibility and/or higher contrast, particularly when the housing is substantially white. Another advantage may be that durable, high precision markings may be provided to product housings. As an example, the markings being provided on a sub-surface of a product housing that not only have high resolution and durability but also provide a smooth and high quality appearance. Another advantage is that the marking techniques are effective for surfaces that are flat or curved.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for marking a two-component housing structure, comprising:
providing a polycarbonate structure for a first component of the two-component housing structure, the polycarbonate structure comprising a crystalline titanium oxide incorporated into the first component of the two-component housing structure;
coating the polycarbonate structure with an acrylic resin directly on the polycarbonate structure, with no intervening material, to provide a second component of the two-component housing structure, the second component being a transparent protective coating on the polycarbonate structure; and
subsequent to coating the polycarbonate structure, producing markings into the polycarbonate structure by directing a laser into the polycarbonate structure and through the transparent protective coating without substantially disturbing the transparent protective coating, the markings being visible through the transparent protective coating, and the markings comprising regions where the crystalline titanium oxide is substantially decrystallized.

2. An electronic device housing, comprising:
a housing structure comprising:
an inner layer including a polycarbonate and a crystalline metal oxide incorporated into the polycarbonate, the inner layer having sidewalls that define an interior volume for receiving electronic components;
an outer layer including an acrylic polymer formed over the inner layer and defining an exterior surface of the electronic device housing; and
markings formed into the polycarbonate at an interface between the inner layer and the outer layer and comprising a region where the crystalline metal oxide is substantially decrystallized, the markings formed by directing a laser to the interface and through the outer layer without substantially disturbing the outer layer to alter a chromaticness magnitude of the polycarbonate and form one or more of a textual or graphical indicia on the housing structure that are visible along the exterior surface of the electronic device housing.

3. The electronic device housing of claim 2, wherein the outer layer is substantially nonporous.

4. The electronic device housing of claim 2, wherein the outer layer has a thickness between approximately 15 microns and approximately 50 microns.

5. The electronic device housing of claim 2, wherein the outer layer comprises an acrylic resin.

6. The electronic device housing of claim 2, wherein the crystalline metal oxide comprises crystalline titanium oxide.

7. The electronic device housing of claim 2, wherein the inner layer of the housing structure is substantially opaque.

8. The electronic device housing of claim 2, wherein the outer layer comprises at least an ultraviolet light cured acrylic resin.

9. The electronic device housing of claim 2, wherein the outer layer is substantially transparent so that the markings at the interface between the inner layer and the outer layer are substantially visible through the outer layer.

10. The electronic device housing of claim 2, wherein the outer layer has a hardness that is substantially greater than a hardness of the inner layer.

11. The electronic device housing of claim 2, wherein the inner layer of the housing structure has a substantially white appearance.

12. The electronic device housing of claim 2, wherein the markings have a substantially black appearance.

13. An electronic device housing, comprising:
a base structure having walls that define an interior volume that is configured to receive electronic components, the base structure formed of a polycarbonate having an outer surface, the base structure comprising a crystalline metal oxide incorporated into the polycarbonate;
a coating layer of an acrylic polymer on the outer surface of the base structure and defining an exterior surface of the electronic device housing; and
substantially altered regions along the outer surface at an interface between the base structure and the coating layer, the substantially altered regions formed by directing a laser through the coating layer, the coating layer being substantially unaltered by the laser, the substantially altered regions comprising regions where the crystalline metal oxide is substantially decrystallized to create a marking that is visible along the exterior surface of the electronic device housing.

14. The electronic device housing of claim 13, wherein the substantially altered regions comprise black markings with low chromaticness magnitude.

15. The electronic device housing of claim 13, wherein the coating layer, having a substantially different composition than the base structure, is substantially harder than the base structure.

16. The electronic device housing of claim 13, wherein the coating layer comprises an ultraviolet light curable transparent acrylic coating.

17. A housing for an electronic device, comprising:
a plastic housing component formed of polycarbonate and a crystalline titanium oxide incorporated into the polycarbonate, the plastic housing component defining a set of sidewalls and an interior volume;
a polymer coating formed over an outer surface of the plastic housing component, the polymer coating including an acrylic resin to provide a transparent protective coating on the plastic housing component and defining an exterior surface of the housing; and
a marking having a darkened region, the marking comprising a substantially decrystallized titanium oxide in the outer surface of the plastic housing component directly beneath the transparent protective coating, the marking formed by altering the outer surface of the plastic housing component by directing a laser through the transparent protective coating, the marking being visible through the transparent protective coating, the transparent protective coating being substantially unaltered by the laser.

18. The housing of claim 17, wherein the polymer coating is formed directly on the plastic housing component with no intervening material.

* * * * *